(12) United States Patent
Janschitz et al.

(10) Patent No.: US 9,374,081 B2
(45) Date of Patent: Jun. 21, 2016

(54) METHOD FOR DRIVING A LOAD

(71) Applicant: Infineon Technologies AG, Neubiberg (DE)

(72) Inventors: Johannes Janschitz, Landskron (AT); Herwig Wappis, Villach (AT); Juergen Schaefer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 694 days.

(21) Appl. No.: 13/745,516

(22) Filed: Jan. 18, 2013

(65) Prior Publication Data

US 2014/0203846 A1    Jul. 24, 2014

(51) Int. Cl.
*H01H 47/00* (2006.01)
*H03K 17/284* (2006.01)
*H03K 17/16* (2006.01)

(52) U.S. Cl.
CPC ............ *H03K 17/284* (2013.01); *H03K 17/166* (2013.01)

(58) Field of Classification Search
CPC ..................... H03K 17/166; H03K 17/284
USPC ......................................................... 307/125
See application file for complete search history.

(56) References Cited

U.S. PATENT DOCUMENTS

| 6,873,201 B2 * | 3/2005 | Panhofer | H03K 17/166 327/427 |
| 7,180,337 B2 * | 2/2007 | Feldtkeller | H03K 4/00 327/108 |
| 2004/0140833 A1 | 7/2004 | Kim | |

FOREIGN PATENT DOCUMENTS

DE    102004036958 A1    3/2006

* cited by examiner

*Primary Examiner* — Hal Kaplan
(74) *Attorney, Agent, or Firm* — Slater Matsil, LLP

(57) ABSTRACT

An electronic switch includes a load path connected in series with the load and a drive terminal for receiving a drive signal. The electronic switch is operable to switch between a first operation state and a second operation state dependent on the drive signal. In a first switching cycle, the electronic switch is switched from the first operation state to the second operation state and a voltage across the load is evaluated during the first switching cycle in order to obtain a measured switching profile. The measured switching profile is compared with a reference profile. A drive profile dependent on the comparison is provided. The drive profile is used to drive the electronic switch in a second switching cycle after the first switching cycle. At least two drive parameters are used at different times in the at least one second switching cycle to drive the electronic switch.

23 Claims, 9 Drawing Sheets

METHOD FOR DRIVING A LOAD

TECHNICAL FIELD

Embodiments of the present invention relate to a method for driving a load, such as an inductive load, and a drive circuit.

BACKGROUND

There is a variety of circuit applications in the automotive or industrial area where it is desired to drive an electrical load. In particular, there are applications in which it is desirable to limit a slew rate of a voltage across the load to a predefined maximum slew rate. Limiting the slew rate may help to reduce or prevent voltage peaks of voltages across parasitic inductances, and, therefore, may help to reduce EMI (Electromagnetic Interference).

Conventional drive circuits for driving electrical loads include an electronic switch, such as a power MOS transistor, connected in series with the load. The series circuit with the load and the electronic switch is connected between voltage supply terminals. Dependent on the desired operation state of the load, the electronic switch is either switched on in order to connect the load to the supply terminals, or is switched off. In these drive circuits, the slew rate of the voltage across the load is dependent on how fast the electronic switch switches from an off-state to an on-state and switches from an on-state to an off-state.

Power MOS transistors are voltage controlled devices that receive a drive voltage at a drive terminal (gate terminal) and that switch on and switch off dependent on the drive voltage. The switching behavior of the MOS transistor may be controlled by providing a filter coupled to the drive terminal and operable to filter the drive voltage. These filters, however, often require the use of passive components, such as resistors or capacitors. Such passive components are difficult to integrate in the semiconductor chip of the power MOS transistor. When implemented as discrete components on a PCB (Printed Circuit Board) such passive components increase the manufacturing costs of the drive circuit.

There is therefore a need to improve conventional drive methods and drive circuits.

SUMMARY OF THE INVENTION

A first embodiment relates to a method for driving a load. The method includes providing an electronic switch, wherein the electronic switch includes a load path connected in series with the load, and a drive terminal for receiving a drive signal, and is operable to switch between a first operation state and a second operation state dependent on the drive signal. In a first switching cycle, the electronic switch is switched from the first operation state to the second operation state, and a voltage across the load is evaluated during the switching cycle in order to obtain a measured switching profile. The measured switching profile is compared with a reference profile and a drive profile is provided dependent on the comparison, and the drive profile is stored. Further, the drive profile is used to drive the electronic switch in at least one second switching cycle after the first switching cycle, wherein the at least two drive parameters are used at different times in the at least one second switching cycle to drive the electronic switch.

A second aspect relates to an electronic circuit. The electronic circuit includes an electronic switch including a load path configured to be connected in series with a load, and a drive terminal configured to receive a drive signal. The electronic switch is operable to switch between a first operation state and a second operation state dependent on the drive signal. The electronic circuit further includes a drive circuit. The drive circuit is configured in a first switching cycle, to switch the electronic switch from the first operation state to the second operation state, and to evaluate a voltage across the load during the first switching cycle in order to obtain a measured switching profile, to compare the measured switching profile with a reference profile and to provide a drive profile dependent on the comparison, to store the drive profile, and to use the drive profile to drive the electronic switch in at least one second switching cycle after the first switching cycle, wherein the at least two drive parameters are used at different times in the at least one second switching cycle to drive the electronic switch.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

In the following Detailed Description, reference is made to the accompanying drawings, which form a part thereof, and in which is shown by way of illustration specific embodiments in which the invention may be practiced.

Figure 1:
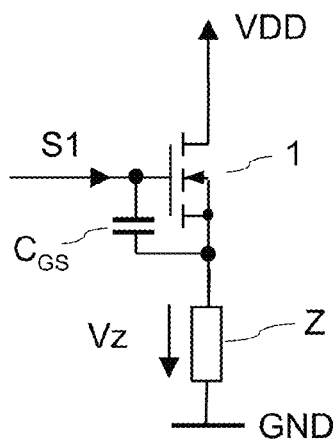
FIG. 1 illustrates an electronic circuit with a load and an electronic switch connected in series with the load.

FIG. 1 illustrates an embodiment of a circuit including an electrical load Z and an electronic switch 1 for driving the load Z. A series circuit with the load Z and the electronic switch 1 is connected between a terminal for a positive supply potential VDD and a terminal for a negative supply potential or reference potential, such as ground GND. In the embodiment of FIG. 1, the load Z and the electronic switch 1 are connected in a high-side configuration. That is, a load path of the electronic switch 1 is connected between the terminal for the positive supply potential VDD and the load Z. However, this is only an embodiment. The principles explained below will also apply to a circuit in which the load Z and the electronic switch 1 are connected in a low-side configuration (not illustrated) in which the electronic switch 1 is connected between the load Z and the terminal for the negative supply potential.

In the embodiment of FIG. 1, the electronic switch 1 is implemented as a MOSFET, specifically as an n-type enhancement MOSFET. This MOSFET includes drain and source terminals D, S and an (internal) load path between the drain and source terminals D, S. The load path is connected in series with the load Z. The MOSFET further includes a gate terminal as a control terminal. The control terminal is configured to receive a drive signal S1, wherein the drive signal S1 is configured to define an operation state of the electronic switch 1. A method for generating the drive signal S1 and an embodiment of a drive circuit that is configured to generate the drive signal S1 is explained in greater detail herein further below.

The principles explained below are not restricted to the use of an n-type MOSFET as the electronic switch 1. Instead, the n-type MOSFET of FIG. 1 could be replaced by any other type of electronic switch, such as another type of MOSFET (Metal-Oxide-Semiconductor Field-Effect-Transistor), an IGBT (Insulated Gate Bipolar Transistor), a BJT (Bipolar Junction Transistor), or a JFET (Junction Field-Effect-Transistor) as well.

The MOSFET of FIG. 1 includes an internal gate-source capacitance $C_{GS}$, which is a capacitance between the gate terminal G and the source terminal S. In FIG. 1, this internal capacitance $C_{GS}$ is represented by a capacitor connected between the gate terminal G and the source terminal S.

The load Z can be any type of electrical load, in particular any type of inductive load. According to one embodiment, the load is a magnetic valve that can be used in an internal combustion machine.

Figure 2:
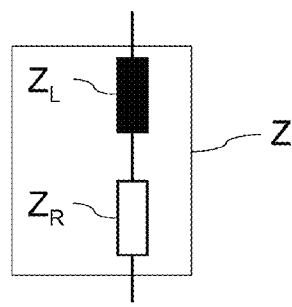
FIG. 2 schematically illustrates one embodiment of a load.

The equivalent circuit diagram of an inductive load Z, such as a magnetic valve, is illustrated in FIG. 2. Referring to FIG. 2, the load Z includes an inductive component $Z_L$ that may represent a solenoid of the magnetic valve, and a resistive component $Z_R$ that may represent the line resistances in the magnetic valve.

Basically, the drive signal S1 switches on and off the electronic switch in order to operate the load Z in different operation states. For explanation purposes it is assumed, that a voltage across the load path D-S of the electronic switch 1 is essentially zero when the electronic switch 1 is switched on. In this case, a load voltage Vz across the load Z corresponds to the supply voltage available between the supply terminals when the electronic switch 1 has been switched on (is in the on-state). When the electronic switch 1 has been switched off (is in the off-state), the load voltage Vz is zero.

According to one embodiment, the drive signal S1 cyclically switches on and off the electronic switch 1. That is, there are several subsequent drive cycles, wherein in each drive cycle the electronic switch 1 is switched on for a first time period (on-period) and is switched off for a second time period (off-period).

Figure 3:
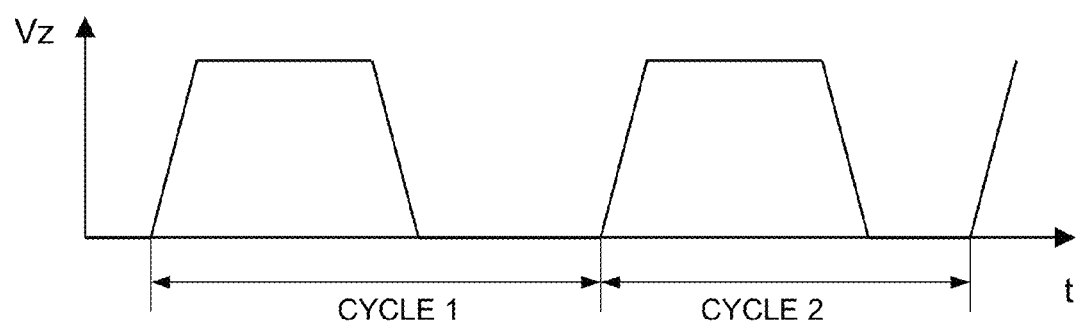
FIG. 3 illustrates a voltage across the load when the electronic switch is cyclically switched on and off.

FIG. 3 schematically illustrates a timing diagram of the load voltage Vz when the electronic switch 1 is cyclically switched on and off. Each time the electronic switch 1 is switched on, the load voltage Vz increases to about the supply voltage, and each time the electronic switch 1 is switched off, the load voltage Vz decreases to zero. Rising edges and falling edges of the load voltage Vz are only schematically illustrated in FIG. 3.

It may be desirable to operate (drive) the electrical load Z such that the load voltage Vz has a predefined signal waveform when the electronic switch 1 switches from a first operation state to a second operation state. The first operation state can be one of the on-state and the off-state, and the second operation state can be the other one of the on-state and the off-state. Defining the signal waveform of the load voltage Vz when the electronic switch 1 switches from the first operation state to the second operation state may be desirable in order to limit a slew rate of the load voltage Vz to a predefined maximum slew rate. This is explained with reference to FIG. 4 in the following.

Figure 4:
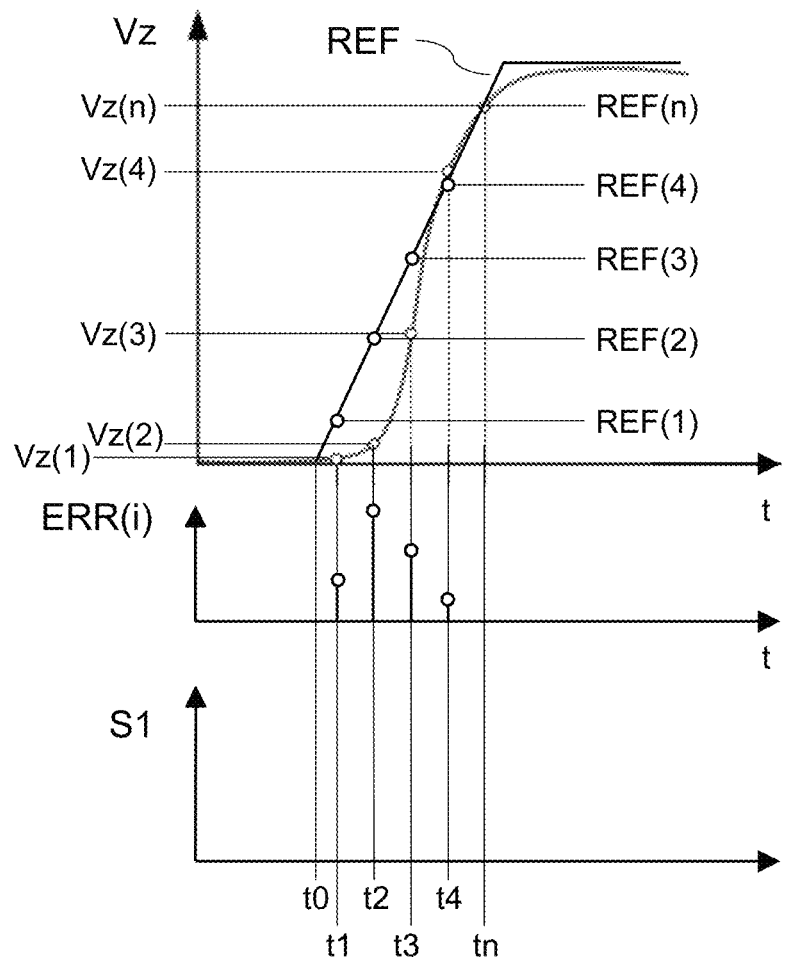
FIG. 4 schematically illustrates timing diagrams of the voltage across the load when the electronic switch is switched on, a reference signal representing a desired voltage across the load, and an error signal representing the difference between the reference signal and the voltage across the load.

FIG. 4 illustrates one example of a timing diagram of the load voltage Vz during a change of the operation state of the electronic switch 1 from an off-state as the first operation state to an on-state as the second operation state. In FIG. 4 t0 denotes a time at which the change of the operation state of the electronic switch 1 starts. Referring to FIG. 4, at first the load voltage Vz increases relatively slowly (until time t2), then increases rapidly (until time tn) and then again increases relatively slowly. A rapid increase of the load voltage Vz, such as between times t2 and tn in FIG. 4, may cause EMI problems. It may therefore be desirable to limit a slew rate of the load voltage Vz to a maximum slew rate. In FIG. 4, a curve labeled with REF represents one embodiment of a desired timing behavior of the load voltage Vz. Curve REF will be referred to as reference curve or reference (load voltage) profile in the following. The curve representing the load voltage Vz over the time will be referred to as switching profile.

The switching profile is dependent on the switching behavior of the electronic switch 1. When, for example, the electronic switch 1 switches very fast from the off-state to the on-state, the load voltage Vz may rapidly increase. In order to reduce the slew rate of the load voltage Vz, it may become necessary to slow down the switching speed of the electronic switch 1. An embodiment of a method that is suitable to adjust the switching speed of the electronic switch 1 such that the switching profile essentially corresponds to the reference profile is explained with reference to FIG. 5 below.

Figure 5:
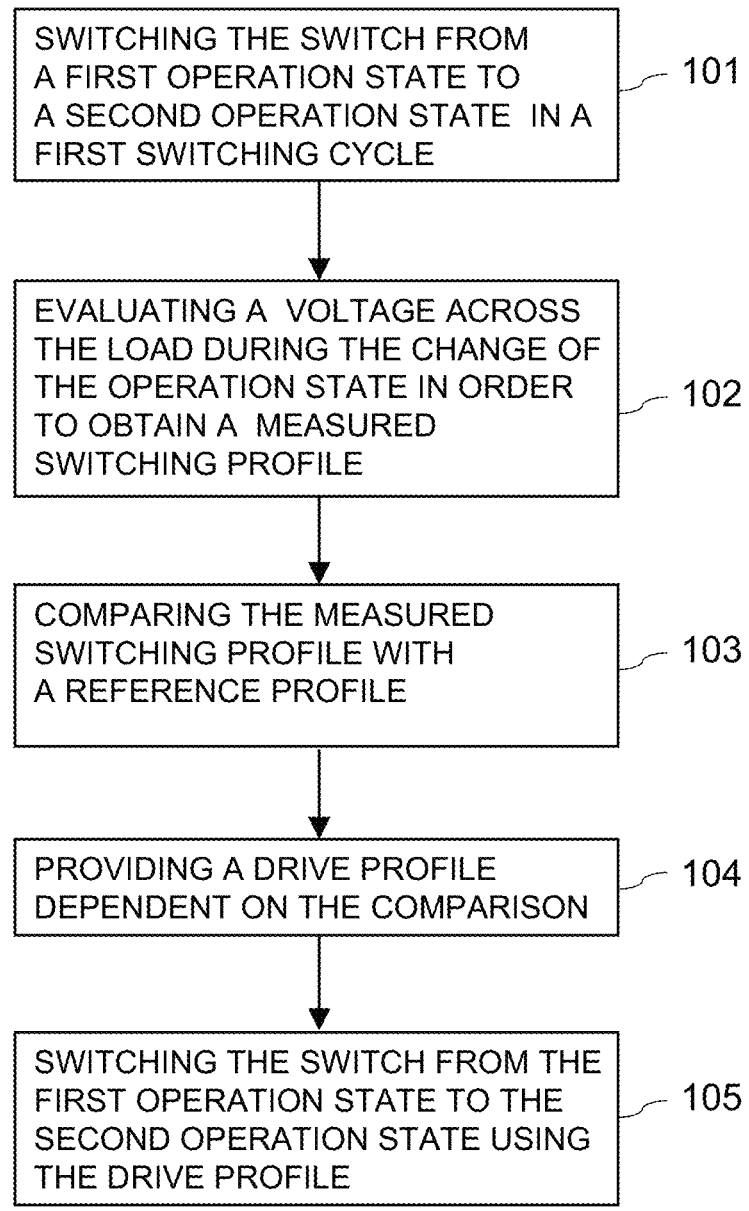
FIG. 5 illustrates methods steps of a method for driving the load in accordance with a first embodiment.

Referring to FIG. 5, the method includes a first step 101 of switching the electronic switch 1 from a first operation state to a second operation state in a first switching cycle. In a further step 102, the voltage Vz across the load Z during the change of the operation state of the electronic switch 1 is evaluated in order to obtain a measured switching profile. An example of the load voltage Vz that may occur when the electronic switch 1 switches from an off-state as the first operation state to an on-state as the second operation state is illustrated in FIG. 4. According to one embodiment, evaluating the load voltage Vz includes measuring the load voltage Vz at least at two different times during the change of the operation state. For illustration purposes, n times t1 to tn, with n≥2, at which the load voltage Vz is measured, are illustrated in FIG. 4. In FIG. 4, n=5. However, this is only an example. The number of times at which the load voltage Vz is measured, can be arbitrary. That is, the number of samples obtained from the load voltage Vz during the change of the operation state can be arbitrary. According to one embodiment, the number n of samples is between 3 and 50, in particular between 5 and 10. The times t1 to tn at which the load voltage Vz is measured, will be referred to as sample times in the following. The levels (values) of the load voltage Vz obtained at the individual sample times will be referred to as sample values in the following. These sample values are labeled with Vz(1) through Vz(n) in FIG. 4.

Referring to FIG. 5, the method further includes (see step 103) comparing the measured switching profile with a reference profile and (see step 104) providing a drive profile dependent on the comparison.

Referring to FIG. 4, comparing the measured switching profile with the reference profile may include calculating differences between the sample values Vz(i) (Vz(i) (denotes any one of the sample values) and the corresponding reference value REF(i). A reference value REF(i) corresponding to a sample value Vz(i) is a reference value that is assigned to the sample time of the sample value. In FIG. 4, reference values REF(1) to REF(n) are assigned to the sample times t1 to tn, respectively. The difference between a sample value Vz(i) and the corresponding reference value REF(i) represents a difference between the instantaneous value of the load voltage Vz at a given sample time and the desired instantaneous value of the load voltage Vz at this sample time. The differences ERR(i), that can also be referred to as errors, obtained at different sample times t1 to tn are also illustrated in FIG. 4.

Referring to FIG. 5, in a further step 104, a drive profile is provided based on the comparison between the measured switching profile and the reference profile. The drive profile includes parameters for generating the drive signal (S1 in FIG. 1). If, for example, the measured switching profile includes n sample values and the reference profile includes a corresponding number of n reference values, a drive profile is generated that includes n drive parameters, wherein each of these drive parameter is used in one time period to define the drive signal S1. Using the drive profile to switch the electronic switch from the first operation state to the second operation state may result in a drive signal S1 that varies over the time period in which the electronic switch 1 switches from the first operation state to the second operation state.

Figure 6:
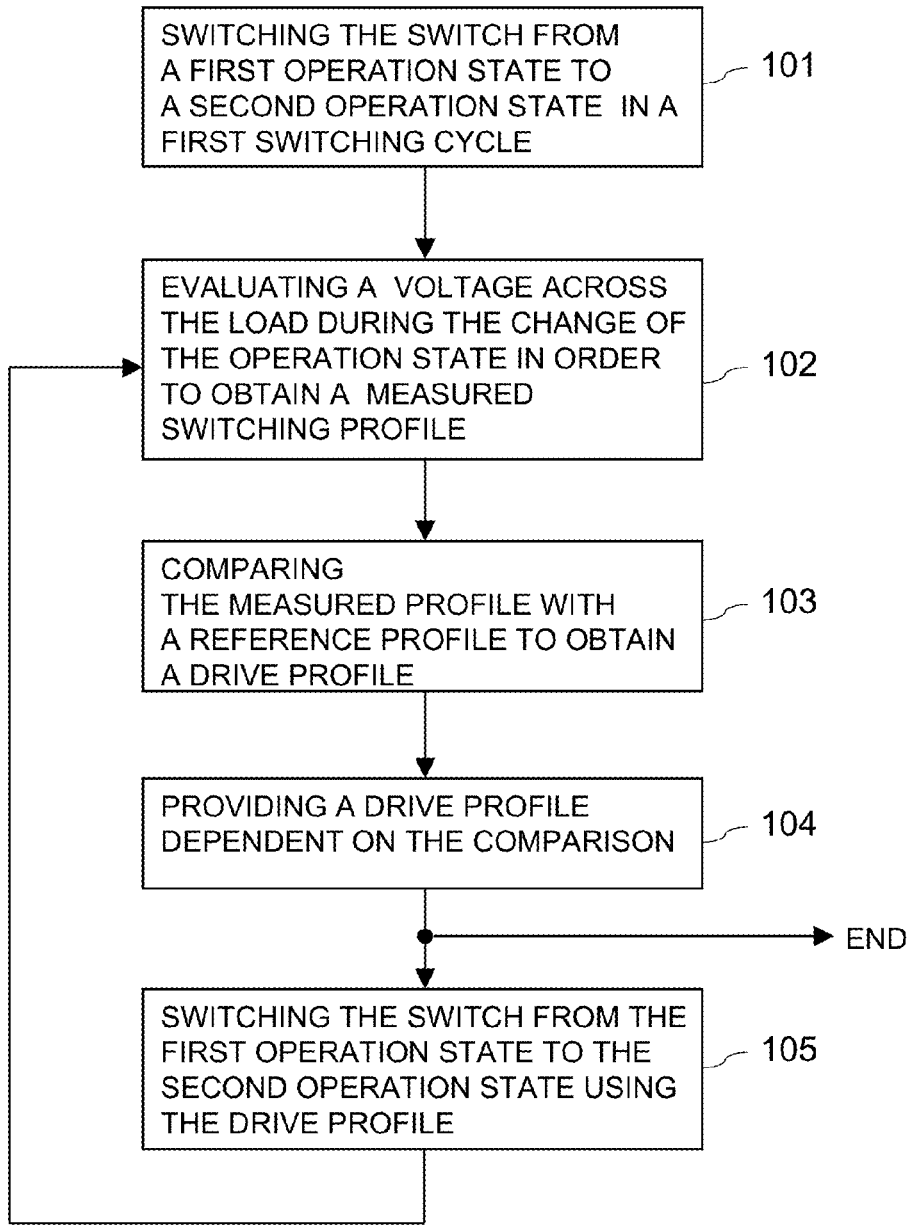
FIG. 6 illustrates methods steps of a method for driving the load in accordance with a second embodiment.

The method explained with reference to FIG. 5 can be part of an iterative process in which the load voltage is evaluated in each switching cycle, wherein in each switching cycle a new drive profile is provided, and wherein the drive profile provided in one switching cycle is used to switch the electronic switch in the next switching cycle. A method in accordance with this embodiment is illustrated in FIG. 6. The method of FIG. 6 is based on the method of FIG. 5, wherein the method of FIG. 6 is applicable to applications in which the electronic switch is cyclically switched on and off in more than two subsequent switching cycles.

Figure 7:
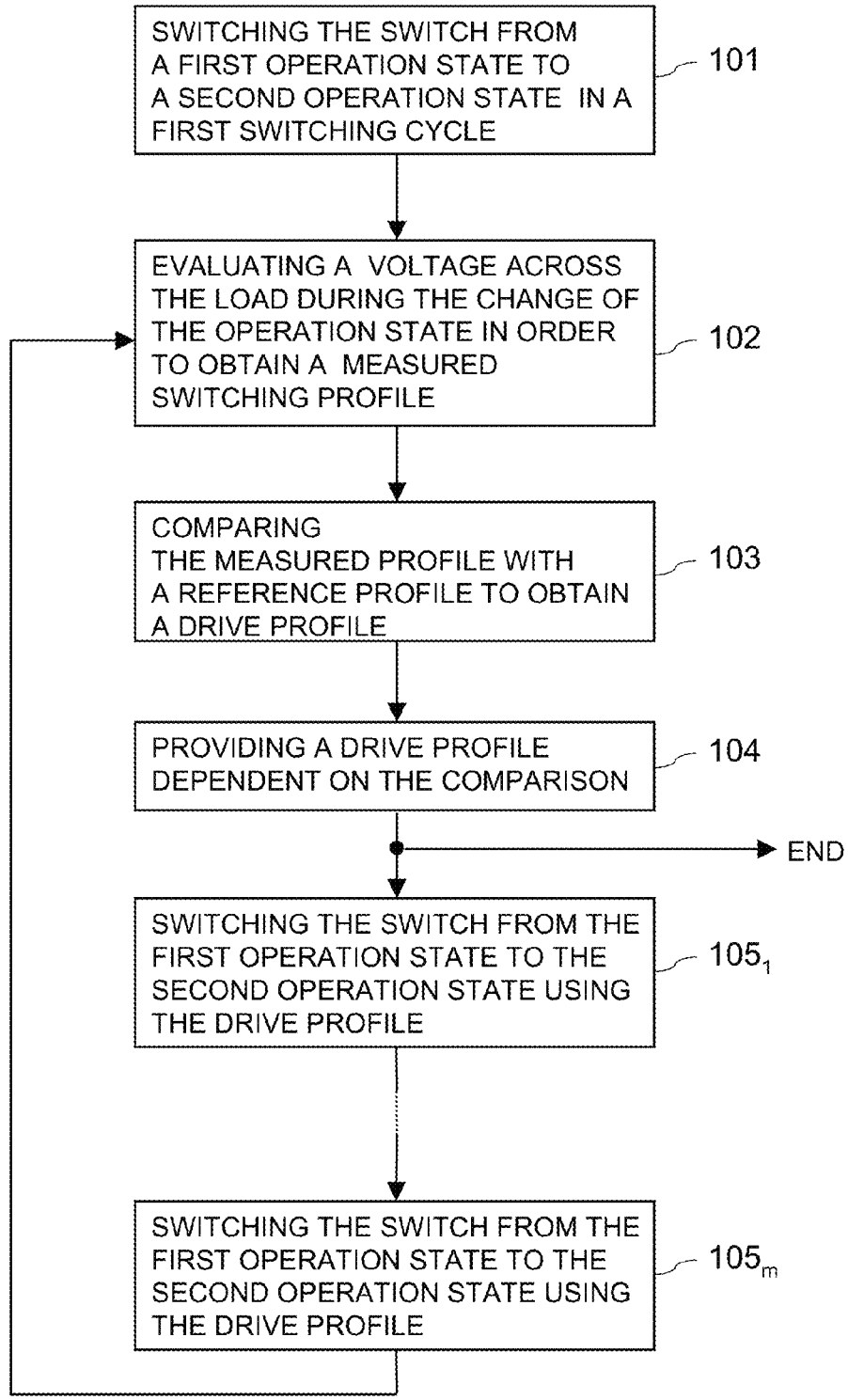
FIG. 7 illustrates methods steps of a method for driving the load in accordance with a third embodiment.

According to a further embodiment, which is illustrated in FIG. 7, the drive profile that is obtained in one switching cycle is used in a number of subsequent switching cycles (represented by boxes $105_1$ through $105_m$) in FIG. 6. In a last one switching cycle $105_m$ of this sequence the load voltage is again evaluated and a new drive profile is obtained (calculated) that is used in the next sequence of switching cycles.

Although the method has been explained in connection with a change of the operation state from an off-state to an on-state of the electronic switch 1, the method can equivalently be used when the electronic switch 1 changes the operation state from the on-state to the off-state.

Figure 8:
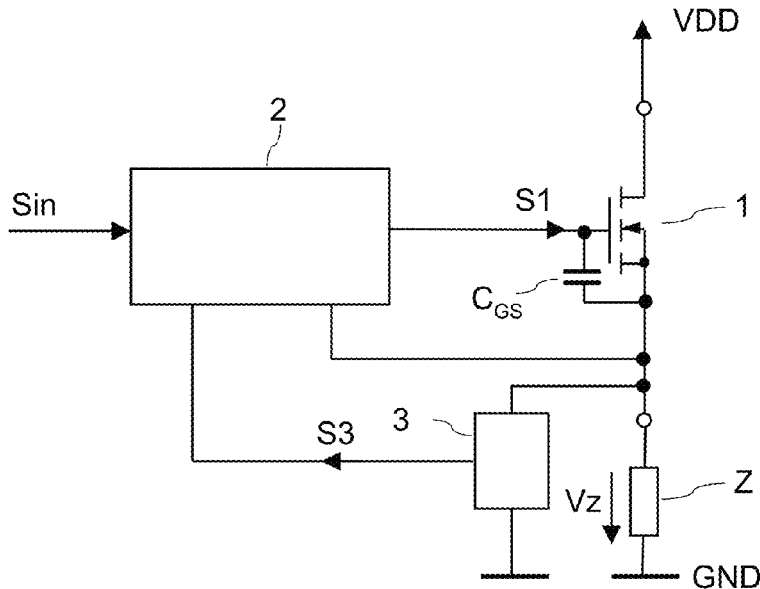
FIG. 8 illustrates one embodiment of a drive circuit for driving the electronic switch.

FIG. 8 schematically illustrates a first embodiment of a drive circuit for generating the drive signal S1 received at the control terminal G of the electronic switch 1. Referring to FIG. 8, the drive circuit includes a measurement circuit 3 that is operable to measure the load voltage Vz across the load Z. This measurement circuit 3 is connected in parallel with the load Z in the present embodiment and is further operable to generate a measurement signal S3 that represents the load voltage Vz. A driver 2 receives the measurement signal S3 from the measurement circuit 3 and an input signal Sin and generates the drive signal S1 dependent on these signals. The input signal Sin defines a desired operation state of the electronic switch 1. That is, the input signal Sin either has an on-level or an off-level, wherein the driver 2 is operable to switch on the electronic switch 1 when the input signal Sin has an on-level and to switch off the electronic switch 1 when the input signal Sin has an off-level. The driver 2 is further operable to timely vary the drive signal S1 such that the electronic switch 1 switches from a first operation state, such as the off-state, to a second operation state, such as the on-state, such that the load voltage Vz during the switching process changes in accordance with a reference curve. A time profile of the drive signal S1 in one switching cycle is calculated by the driver 2 dependent on the switching profile of the load voltage Vz that was measured in a previous switching cycle.

Figure 9:
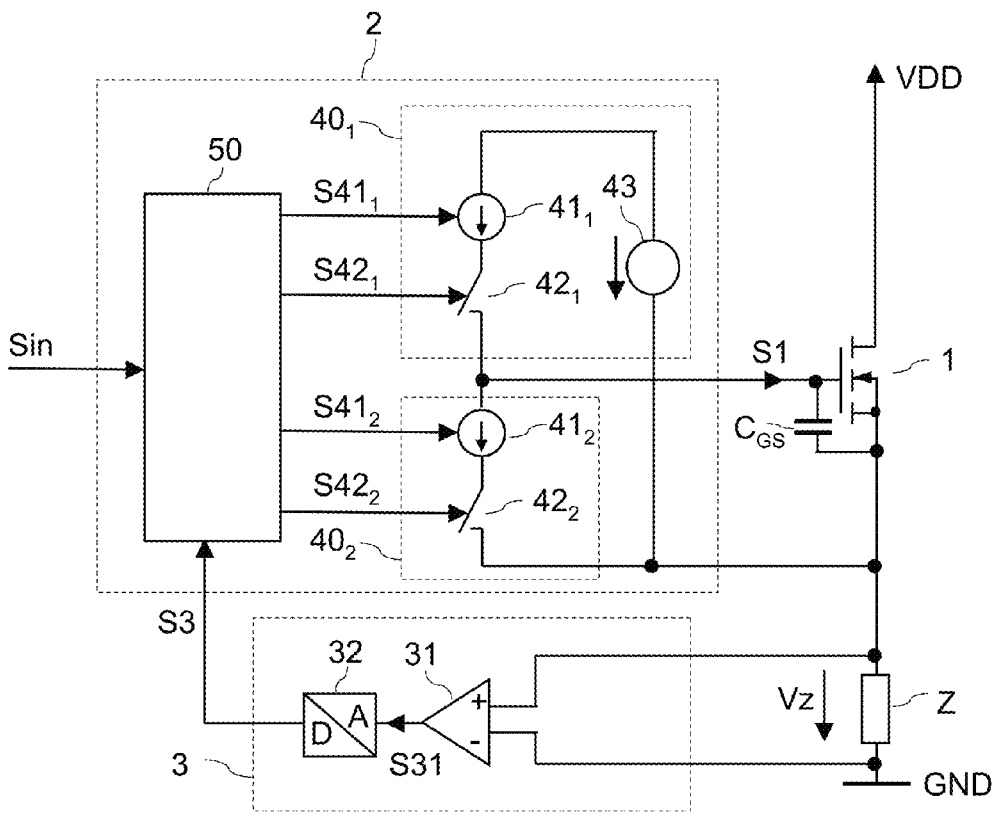
FIG. 9 illustrates one embodiment of the drive circuit of FIG. 8 in greater detail.

FIG. 9 shows embodiments of the measurement circuit 3 and the driver 2 in greater detail. Referring to FIG. 9, the measurement circuit 3 includes an amplifier 31 that senses the voltage Vz across the load and provides an analog measurement signal S31 representing the voltage Vz across the load Z to an analog-to-digital converter (ADC) 32. The ADC 32 samples the measurement signal S31 received from the amplifier 31 in order to obtain sample values of the measurement signal S31 and provides digital representations of these sample values to the driver 2. In this embodiment, the measurement signal S3 received by the driver 2 includes a sequence of digital representations of the measurement signal, wherein the measurement signal represents the voltage Vz across load Z.

Figure 10:
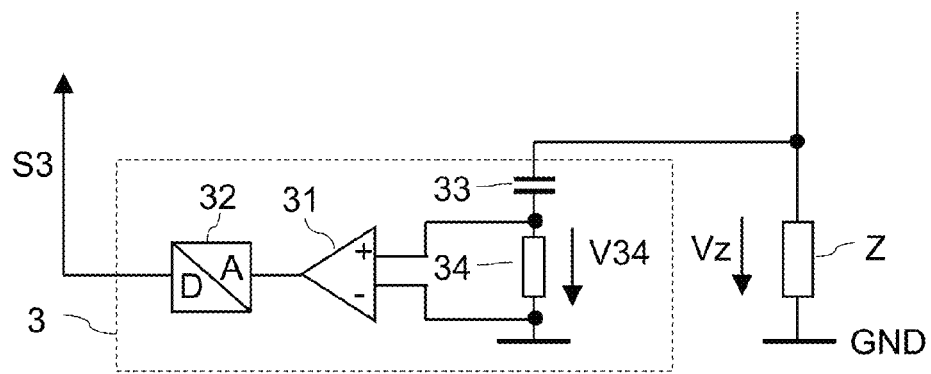
FIG. 10 illustrates one embodiment of a control circuit of the drive circuit of FIG. 9.

According to a further embodiment illustrated in FIG. 10, the measurement circuit 3 does not measure the voltage Vz, but measures a time derivative of the load voltage Vz. In this case, a series circuit with a capacitor 33 and a resistor 34 is connected in parallel with the load Z, wherein the amplifier 31 senses the voltage V34 across the resistor 34. The voltage V34 across the resistor 34 represents the time derivative dVz/dt of the load voltage Vz, because this voltage V34 is proportional to a current through the capacitor 33, wherein the current through the capacitor 33 is dependent on a time derivative of the load voltage Vz. Detecting the time derivative dVz/dt of the load voltage Vz instead of the load voltage Vz is, for example, useful in those cases in which it is desired to control the electronic switch 1 such that a slew rate of the load voltage Vz is constant during the switching processes. In this case, the driver 2 generates the drive profile such that the time derivative of the load voltage Vz during the switching process, that is when the electronic switch 1 switches from a first operation state to a second operation state, is constant.

In the following, the measurement signal S3 received by the driver 2 will be referred to as sample signal. Just for explanation purposes it is assumed that the sequence of samples (more precisely, digital representations of the samples) included in the sample signal represent samples of the load voltage Vz. Thus, those samples obtained during one switching process correspond to the samples Vz(i) explained with reference to FIG. 4.

Referring to FIG. 9, the driver 2 includes a control circuit 50 receiving the input signal Sin and the sample signal S3. The driver 2 further includes a first drive unit $40_1$ that is operable to switch on the electronic switch 1, and a second drive unit $40_2$ that is operable to switch off the electronic switch 1. In the present embodiment, each of the first and second drive units $40_1$, $40_2$ includes a series circuit with a current source $41_1$, $41_2$ and a switch $42_1$, $42_2$. The series circuit with the current source $41_1$ and the switch $42_1$ of the first drive unit $40_1$ receives a supply voltage from a supply voltage source 43 and is connected between the supply voltage source 43 and the control terminal G of the electronic switch 1. The supply voltage source 43 provides a supply voltage that is referenced to the electrical potential at the source terminal S in the present embodiment. The series circuit with the current source $41_2$ and the switch $42_2$ of the second drive unit $40_2$ is connected between the control terminal G and the source terminal S of the electronic switch 1.

The control circuit 50 is operable to activate the first drive unit $40_1$ whenever the input signal Sin indicates that it is desired to switch on the electronic switch 1. That is, the control circuit 50 activates the first drive unit $40_1$ each time the input signal Sin has an on-level. The implementation of the first drive unit $40_1$ with a current source $41_1$ and a switch $42_1$ is just an example. Any other type of drive unit that can be activated and deactivated and that provides an adjustable output current may be used as well. In the present embodiment, the control circuit 50 switches on the switch $42_1$ in order to activate the first drive unit $40_1$ and switches off the switch $42_1$ in order to deactivate the first drive unit $40_1$ connected in series with the current source $41_1$.

Equivalently, the control circuit 50 is operable to activate the second drive unit $40_2$ whenever the input signal Sin indicates that it is desired to switch off the electronic switch 1. That is, each time the input signal Sin has an off-level, the control circuit 50 activates the second drive unit $40_2$ by switching on the switch $42_2$.

Further, the control circuit 50 activates only one of the first and second drive units $40_1$, $40_2$ at one time. That is, the control circuit 50 deactivates the second drive unit $40_2$ (by switching off the switch $42_2$) when the first drive unit $40_1$ is activated, and the control circuit 50 deactivates the first drive unit $40_1$ (by switching off the switch $42_2$) when the second drive unit $40_2$ is activated.

In order to control the switching speed of the electronic switch 1 and to therefore control the waveform of the load voltage Vz during switching operations, the control circuit 50 is further operable to vary a drive current $I41_1$ provided by the current source $41_1$ in the first drive unit $40_1$, and to vary a drive current $I41_2$ provided by the current source $41_2$ in the second drive unit $40_2$. In each switching cycle, the control circuit 50 varies the drive currents $I42_1$, $I42_2$ dependent on drive profiles obtained in a previous switching cycle. The control circuit 50 stores two drive profiles, namely a first drive profile that is used to vary the first drive current $I41_1$ when the electronic switch switches from the off-state to the on-state, and a second drive profile that is used to vary the second drive current $I41_2$ when the electronic switch 1 switches from the on-state to the off-state. According to a further embodiment, only one of the first and second drive units $40_1$, $40_2$ is operable to output a variable drive current. In this case, the control circuit stores only one of the first and second drive profiles, so as adjust the switching speed only in one of the two possible changes of the operation state.

Figure 11:
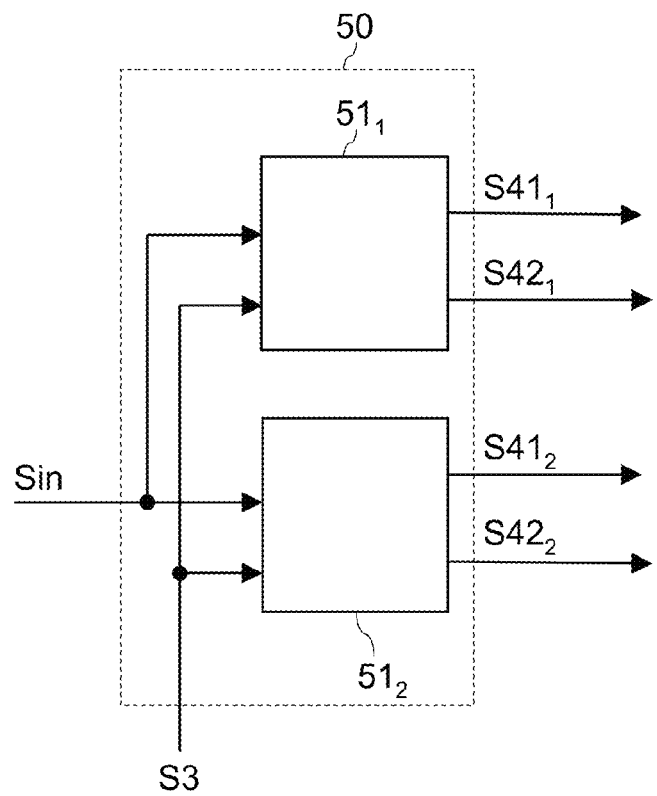
FIG. 11 illustrates one embodiment of a controller in the control circuit of FIG. 10.
Figure 12:
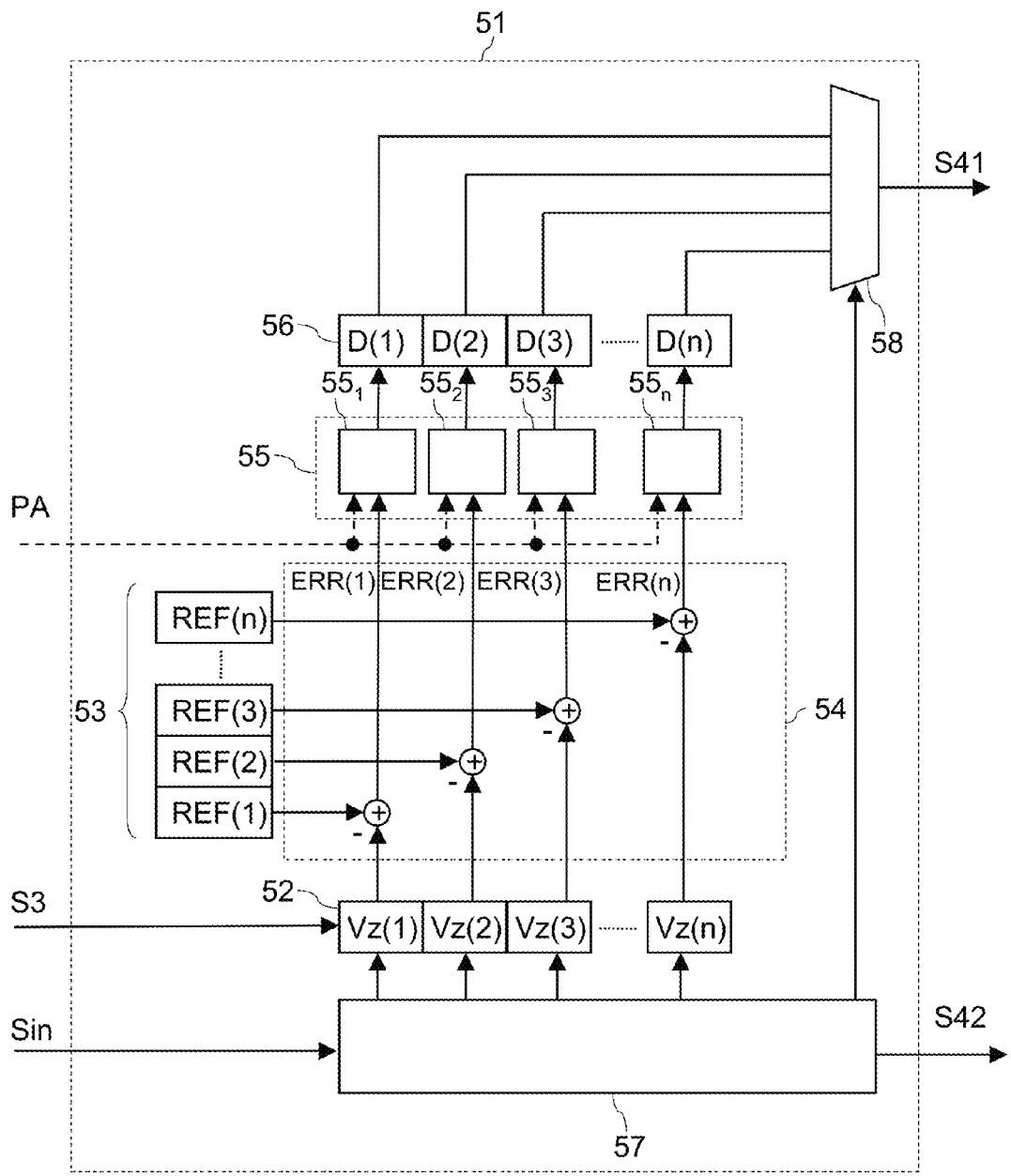
FIG. 12 illustrates one embodiment of the controller of FIG. 11 in greater detail.

An embodiment of a control circuit 50 that is operable to control the first and second drive units is schematically illustrated in FIG. 11. The control circuit 50 of FIG. 11 includes a first control unit $51_1$ that is operable to control the first drive unit $40_1$ (not illustrated in FIG. 11) through control signals $S41_1$, $S42_1$. Further, the control circuit 50 includes a second control unit $51_2$ that is operable to control the second drive unit $40_2$ (not illustrated in FIG. 11) through the corresponding control signals $S41_2$, $S42_2$. Each of the control units $51_1$, $51_2$ receives the input signal and the sample signal S3. The individual control units $51_1$, $51_2$ can be implemented with identical function units. One embodiment of one of the control units $51_1$, $51_2$ is illustrated in FIG. 12. In FIG. 12, reference character 51 denotes one of the first and second control units $51_1$, $51_2$ that controls one of the first and second drive units $40_1$, $40_2$ (not illustrated in FIG. 12).

Referring to FIG. 12, the control unit 51 includes a first storage 52 such as a register that is configured to store a sequence of samples of the samples signal S3. A control unit 57 receives the input signal Sin and is operable to control storing of samples from the sample signal S3 in the first storage unit 52. In the first control unit $51_1$ (see FIG. 11), the internal control unit 57 is operable to control the first storage 52 such that a sequence of samples from the samples signal S3 is stored in the first storage 52 after the input signal Sin assumes an on-level. Correspondingly, internal control unit 57 in the second control unit $51_2$ (see FIG. 11) is operable to control the storage 52 such that a sequence of samples is stored after the input signal Sin assumes an off-level. The number of samples stored in the storage 52 is dependent on the desired drive profile. If, for example, it is desired to generate a drive profile with n different drive parameters, a corresponding number of samples are stored in the storage 52. Referring to the explanation provided in connection with FIG. 4, the samples stored in the first storage 52 correspond to the measurement values Vz (1) to Vz(n). In the following, Vz(i) denotes an arbitrary one of the measurement values (samples) Vz(1) to Vz(n). These samples can be samples that represent the load voltage Vz, or can be samples that represent the time derivative of the load voltage Vz (as explained with reference to FIG. 10).

Referring to FIG. 12, the control unit 51 further includes a second storage 53 that is operable to store reference values corresponding to the samples stored in the first storage 52. These reference values REF(1)-REF(n) correspond to the reference values explained with reference to FIG. 4. In the following, REF(i) denotes an arbitrary one of the reference values REF(1) to REF(n). An error calculation unit 54 receives the sample values from the first storage 52 and the reference values from the second storage 53 and calculates the difference between one sample and the corresponding reference value in order to provide a plurality of error values ERR(1) to ERR(n). In the following, ERR(i) denotes an arbitrary one of the error values ERR(1) to ERR(n). Each error value ERR(i) represents the difference between one sample Vz(i) and the corresponding reference value REF(i).

A filter unit 55 includes a plurality of filters $55_1$-$55_n$, wherein each $55_i$ of the filters $55_1$-$55_n$ receives one error value ERR(i) and outputs the corresponding drive parameter D(i) at an output. The individual drive parameters D(1) to D(n) are stored in a third storage 56. In general, each filter 55, calculates one drive parameter D(i) dependent on the corresponding error value ERR(i), that is $$D(i)=f(ERR(i)) \qquad (1)$$

where f(.) denotes a mathematical function implemented in each filter that maps one error value ERR(i) to one drive parameter D(i).

According to one embodiment, each filter $55_i$, in one switching cycle, calculates the drive parameters D(i) not only dependent on the error value ERR(i) calculated from a sample value Vz(i) obtained in the previous switching cycle, but also dependent on a drive parameter $D_{-1}(i)$ and an error value $ERR_{-1}(i)$ calculated in the previous switching cycle, that is $$D(i)=g(ERR(i), D_{-1}(i), ERR_{-1}(i)) \qquad (2),$$

where g(.)denotes a mathematical function implemented in each filter that calculates one drive parameter D(i) dependent on the corresponding error value ERR(i), the drive parameter $D_{-1}(i)$ that was previously stored in the memory 56 and the error value $ERR_{-1}(i)$ obtained in the previous switching cycle. In this embodiment, the error values ERR(i) obtained in one switching cycle are stored and each of the stored error values is received by one filter $55_i$ in a subsequent switching cycle.

The individual filters $55_1$-$55_n$ can be implemented as proportional filters (P-filters), integral filters (I-filters) or proportional-integral filters (PI-filters). According to one embodiment, the individual filters are PI-filters that calculate the individual drive parameters D(i) as follows:

$$D(i) = D_{-1}(i) + K_P \cdot (ERR(i) - ERR_{-1}(i)) + K_P \cdot T_A / T_N \cdot ERR_{-1}(i) \quad (3),$$

where $K_P$ and $T_N$ are filter coefficients and $T_A$ represents the duration of one switching cycle.

A multiplexer 58 is coupled to the third storage 56 and is operable to provide the current source control signal S41 as a sequence of parameter values stored in the third storage 56. Referring to the explanation provided before, the individual drive parameters D(1) to D(n) form a drive profile that is used to drive the electronic switch 1 in one switching cycle, wherein the drive profile has been obtained in a previous switching cycle.

According to one embodiment, control parameters of the individual control units $55_1$-$55_n$ can be set through an external parameter signal PA. This external parameter signal allows a user to adapt the regulation algorithm during the use of the electronic circuit. According to one embodiment, the control parameters can be adjusted dependent on the gate-source capacitance of the electronic switch 1.

Figure 13:
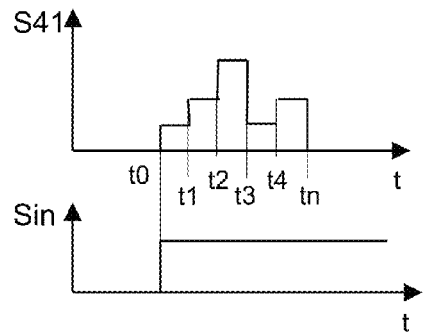
FIG. 13 illustrates the operating principle of the controller of FIG. 12.

The generation of the current source control signal S41 from the drive parameters is schematically illustrated in FIG. 13 in which timing diagrams of the current source control signal S41 and the input signal Sin is illustrated. For explanation purposes it is assumed that the current source control signal S41 of FIG. 13 is used in switching on the electronic switch 1. Referring to FIG. 13, the input signal Sin assumes an on-level at time t0. Beginning at this time, the current source control signal S41 is generated as a signal with a timely varying amplitude, wherein a first drive parameter D(1) defines the amplitude in a first time period [t0, t1], a second drive parameter D(2) defines the amplitude in a second time period [t1, t2], and so on. The amplitude of the current source control signal S41 defines the instantaneous value of the current source $(41_1, 41_2)$ in FIG. 9.

Figure 14:
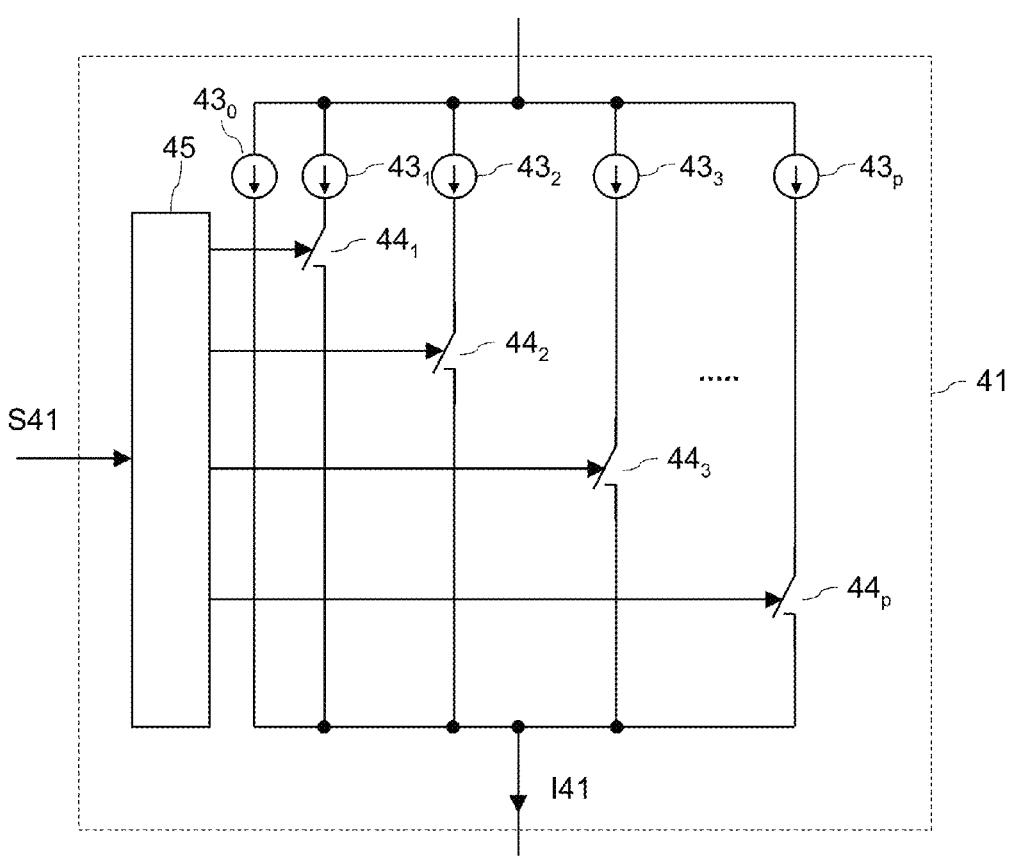
FIG. 14 illustrates one embodiment of a controllable current source.

One embodiment of a current source 41 is schematically illustrated in FIG. 14. In this embodiment, the current source 41 includes a plurality of current sources $43_1$, $43_2$, $43_p$ that are connected in parallel. Each of these current sources $43_1$-$43_p$ can be activated or deactivated. In FIG. 14, means for activating or deactivating the individual current sources $43_1$-$43_p$ are represented by switches $44_1$-$44_p$ connected in series with the individual current sources $43_1$, $43_p$. A selection circuit 45 receives the current source control signal S41 and is operable to activate the individual current sources $43_1$, $43_p$ such that an overall output current 41 of the current source 41 corresponds to a current as defined by the current source control signal S41.

According to one embodiment, there is at least one current source $43_0$ that is always activated when the current source 41 is activated (that is when the switch $(42_1, 42_2$ in FIG. 9) connected in series with the current source 41 is closed). This makes sure that the electronic switch 1 reaches a defined switching state even if an error in the calculation of the drive parameters D(i) would occur.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for driving a load, the method comprising:
providing an electronic switch comprising a load path coupled in series with the load and a drive terminal for receiving a drive signal, the electronic switch operable to switch between a first operation state and a second operation state dependent on the drive signal;
in a first switching cycle, switching the electronic switch from the first operation state to the second operation state and evaluating a voltage across the load during the first switching cycle in order to obtain a measured switching profile;
comparing the measured switching profile with a reference profile and providing a drive profile dependent on the comparison; and
using the drive profile to drive the electronic switch in a second switching cycle after the first switching cycle, wherein drive parameters are used at different times in the second switching cycle to drive the electronic switch.

2. The method of claim 1, wherein evaluating the voltage across the load comprises:

evaluating the voltage at a plurality of different times during the switching the electronic switch from the first operation state to the second operation state, wherein the drive profile includes the drive parameters.

3. The method of claim 1, wherein the drive profile is used in only one second switching cycle that directly succeeds the first switching cycle.

4. The method of claim 1, wherein the drive profile is used in a plurality of subsequent second switching cycles after the first switching cycle.

5. The method of claim 1, wherein the first operation state is an on-state and the second operation state is an off-state.

6. The method of claim 1, wherein the first operation state is an off-state and the second operation state is an on-state.

7. The method of claim 1,
wherein the electronic switch comprises a transistor; and
wherein driving the electronic switch comprises outputting a drive current to a control terminal of the transistor.

8. The method of claim 7, wherein the transistor is selected from the group consisting of:
an MOS (Metal Oxide Semiconductor) transistor;
an IGBT (Insulated Gate Bipolar Transistor);
a BJT (Bipolar Junction Transistor); and
a JFET (Junction Field-Effect Transistor).

9. The method of claim 7, wherein the drive current is dependent on the drive profile.

10. The method of claim 1, wherein evaluating the voltage across the load comprises evaluating a time derivative of the voltage across the load.

11. An electronic circuit, comprising:
an electronic switch comprising a load path configured to be coupled in series with a load and a drive terminal configured to receive a drive signal, wherein the electronic switch is operable to switch between a first operation state and a second operation state dependent on the drive signal; and
a drive circuit configured
in a first switching cycle, to switch the electronic switch from the first operation state to the second operation state, and to evaluate a voltage across the load during the first switching cycle in order to obtain a measured switching profile,
to compare the measured switching profile with a reference profile and to provide a drive profile dependent on the comparison,
to store the drive profile, and
to use the drive profile to drive the electronic switch in a second switching cycle after the first switching cycle, wherein drive parameters are used at different times in the second switching cycle to drive the electronic switch.

12. The electronic circuit of claim 11, wherein the drive circuit is configured to evaluate the voltage at least at two different times during the switching the electronic switch from the first operation state to the second operation state, wherein the drive profile includes the drive parameters.

13. The electronic circuit of claim 11, wherein the drive circuit is configured to use the drive profile in only one second switching cycle that directly succeeds the first switching cycle.

14. The electronic circuit of claim 11, wherein the drive circuit is configured to use the drive profile in a plurality of subsequent second switching cycles after the first switching cycle.

15. The electronic circuit of claim 11, wherein the first operation state is an on-state and the second operation state is an off-state.

16. The electronic circuit of claim 11, wherein the first operation state is an off-state and the second operation state is an on-state.

17. The electronic circuit of claim 11,
wherein the electronic switch comprises a transistor, and
wherein the drive circuit is configured to drive the electronic switch by outputting a drive current to a control terminal of the transistor.

18. The electronic circuit of claim 17, wherein the electronic switch comprises a transistor selected from the group consisting of:
an MOS (Metal Oxide Semiconductor) transistor;
an IGBT (Insulated Gate Bipolar Transistor);
a BJT (Bipolar Junction Transistor); and
a JFET (Junction Field-Effect Transistor).

19. The electronic circuit of claim 17, wherein the drive circuit is configured to output the drive current dependent on the drive profile.

20. The electronic circuit of claim 17, wherein the drive circuit is configured to evaluate a time derivative of the voltage across the load.

21. The electronic circuit of claim 11, wherein the drive circuit comprises:
a measurement circuit configured to evaluate a voltage across the load and to output a measurement signal; and
a driver configured to receive the measurement signal and to drive the electronic switch.

22. The electronic circuit of claim 21, wherein the measurement circuit is configured to evaluate a time derivative of the voltage across the load.

23. The electronic circuit of claim 22, wherein the measurement circuit comprises:
a series circuit with a capacitor and a resistor, wherein the series circuit is configured to be connected in parallel with the load,
wherein the measurement circuit is configured to generate the measurement signal dependent on a voltage across the resistor.

* * * * *